United States Patent
Dangelo et al.

(10) Patent No.: US 7,292,023 B2
(45) Date of Patent: Nov. 6, 2007

(54) APPARATUS AND METHOD FOR LINKED SLOT-LEVEL BURN-IN

(75) Inventors: Daniel J. Dangelo, Phoenix, AZ (US); Paul J. Klebek, Dallas, TX (US); Harold W. Preston, Carrollton, TX (US); Chris Schroeder, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 10/883,027

(22) Filed: Jun. 30, 2004

(65) Prior Publication Data

US 2006/0001436 A1 Jan. 5, 2006

(51) Int. Cl.
*G01R 31/28* (2006.01)
(52) U.S. Cl. .................................................. 324/158.1
(58) Field of Classification Search .............. 324/760, 324/765, 158.1; 209/651, 573; 414/586, 414/422, 783
See application file for complete search history.

(56) References Cited

U.S. PATENT DOCUMENTS 5,104,277 A * 4/1992 Bullock ..................... 414/280
5,680,936 A * 10/1997 Beers ........................ 209/564
6,248,967 B1 * 6/2001 Nakamura .................. 209/573
6,384,593 B1 * 5/2002 Kobayashi et al. ...... 324/158.1
6,479,982 B1 * 11/2002 Lee et al. ................ 324/158.1
6,844,717 B2 * 1/2005 Shim et al. .............. 324/158.1
6,861,861 B2   3/2005 Song et al.
6,876,192 B2 * 4/2005 Seppala et al. .......... 324/158.1
2002/0041181 A1 * 4/2002 Kim et al. ............... 324/158.1
2002/0154491 A1 * 10/2002 Suhara ....................... 361/752
2003/0184281 A1 * 10/2003 Seppala et al. .......... 324/158.1
2004/0046544 A1 * 3/2004 Hiltawski ................ 324/158.1

* cited by examiner

*Primary Examiner*—Ha Tran Nguyen
*Assistant Examiner*—Tung X. Nguyen
(74) *Attorney, Agent, or Firm*—Marger Johnson & McCollom, PC

(57) ABSTRACT

A Burn-In Board (BIB) transfer module links a Burn-In Board (BIB) Loader/Unloader (BLU) to a burn-in chamber rack. The BIB transfer module is capable of transferring a BIB between the BLU and the burn-in chamber rack by moving the BIB in at least two perpendicular directions while minimizing the physical footprint required by the BIB transfer module. The BIB transfer module supports slot level burn-in of components as opposed to batch level burn-in because the burn-in chamber rack may begin the burn-in process as soon as a BIB is delivered to an individual chamber slot in the burn-in chamber rack. The BIB transfer module may easily be detached and separated from the BLU and the burn-in chamber rack without affecting the continuing operation of the BLU and the burn-in chamber rack.

8 Claims, 7 Drawing Sheets

APPARATUS AND METHOD FOR LINKED SLOT-LEVEL BURN-IN

BACKGROUND OF THE INVENTION

1. Technical Field of the Invention

This disclosure relates in general to devices and methods that are used in burn-in systems, and more particularly, to an apparatus and method that provides for linked, slot-level burn-in of components.

2. Description of the Related Art

The term "burn-in" refers to an electrical stress test that employs voltage and temperature to accelerate the electrical failure of a device. Burn-in essentially simulates the operating life of the device, since the electrical excitation applied during burn-in may mirror the worst-case bias that the device will be subjected to in the course of its useable life. Depending on the burn-in duration used, the reliability information obtained may pertain to the device's early life or its wear-out. Burn-in may be used as a reliability monitor or as a production screen to weed out potential infant mortalities from the lot.

Burn-in is typically done at an elevated temperature while electrical excitation is applied to the sample devices. The burn-in process is facilitated by using burn-in boards (BIBs). A number of sample devices may be placed on each BIB, and the BIBs are then inserted into a burn-in chamber that supplies the necessary voltages to the samples while maintaining the chamber at the desired temperature. The burn-in chamber includes a number of chamber slots, each slot configured to accommodate one BIB and the components that it holds. The electrical bias applied to the devices may either be static or dynamic, depending on the failure mechanism that is being accelerated during the burn-in process.

Some conventional component burn-in systems are not automated. That is, operators must manually load the BIBs with devices, place the BIBs in the slots of the burn-in chamber, remove the BIBs, remove the baked devices from the BIBs, and then repeat the process for the other unbaked devices.

Other conventional burn-in systems are partially automated. For example, a conventional piece of automated equipment that is often used in burn-in systems is known as a Burn-in board Loader/Unloader (BLU). The BLU may be used to mechanically load devices from a JEDEC tray to a BIB or vice versa. The term "JEDEC tray" refers to a component packaging tray that is standardized across the industry for each type of device package, i.e., Pin Grid Array packages (PGAs), Ball Grid Array packages (BGAs), Ceramic Quad Fine Pitch packages (CQFPs), etc. However, once the components are transferred to the BIBs, the operators must still manually transfer the BIBs to the other units of the burn-in system, for example, the burn-in chamber. Since the BLUs and burn-in chambers of a conventional burn-in system are typically spread widely throughout a room, trolleys or carts are used to manually transport a large number of trays or BIBs to, from, or between the BLUs and burn-in chambers.

The conventional systems and methods of burn-in described above are manually intensive, costly, and require large physical spaces. Conventional burn-in systems are also susceptible to "staging", meaning that because the system components are not linked, the operators will typically wait until a trolley or cart is completely filled with BIBs before moving the BIBs to the burn-in chamber. Embodiments of the invention address these and other disadvantages inherent in the above-described conventional burn-in systems.

BRIEF DESCRIPTION OF THE DRAWINGS

Some exemplary embodiments of the invention will be explained below with reference to the following diagrams, where like reference numerals refer to like elements throughout.

DETAILED DESCRIPTION OF THE INVENTION

In the following detailed description, exemplary embodiments of the invention will be described with reference to the FIGURES. It should be recognized that the exemplary embodiments described below are not intended to be a comprehensive list of all embodiments of the invention. Rather, the embodiments are described for illustrative purposes so that others of skill in the art may easily understand the inventive concepts that may be characteristic of any number of specific embodiments of the invention.

Embodiments of the invention provide a burn-in system that significantly improves burn-in chamber utilization while reducing the physical footprint. According to some embodiments of the invention, a burn-in system includes a BLU that quickly transfers components to/from standard JEDEC trays and BIBs. The system further includes at least one BIB transfer module that may automatically load BIBs with unbaked components into a chamber slot of the burn-in chamber. The BIB transfer module may also automatically unload the BIBs with baked components and return them to the BLU, where they are subsequently unloaded and returned to a JEDEC tray.

These and other features and advantages of embodiments of the invention will be explained in further detail in the discussion that follows.

Figure 1:
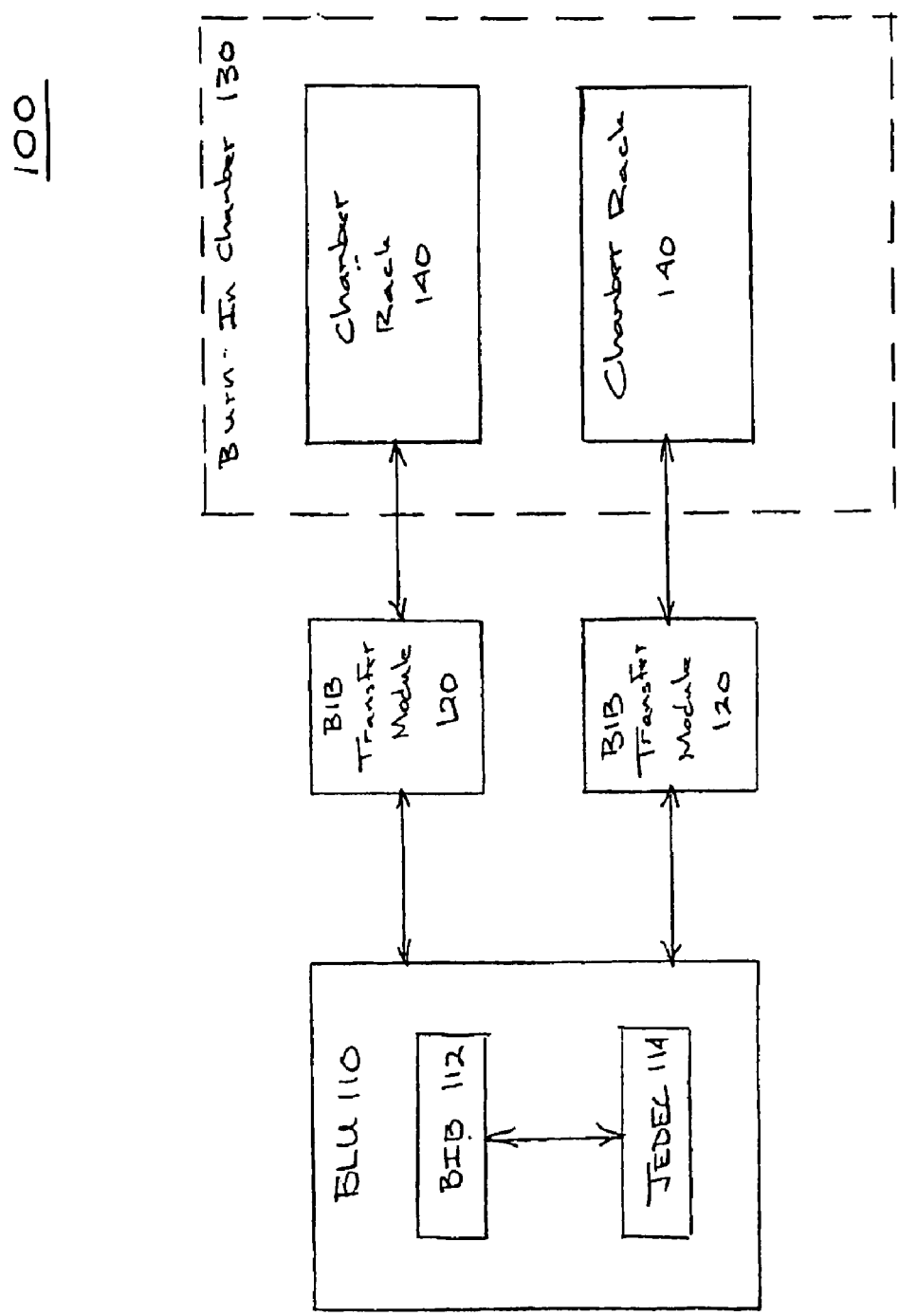
FIG. 1 is a block diagram that conceptually illustrates some transfer processes between components of a burn-in system according to some embodiments of the invention.

FIG. 1 is a block diagram that conceptually illustrates some transfer processes between components of a linked module burn-in system 100 according to some embodiments of the invention. The burn-in system 100 includes a BLU 110. The BLU 110 may transfer components from a standardized JEDEC tray 114 to a BIB 112 and vice versa. The burn-in system 100 also includes two BIB transfer modules 120. Each of the BIB transfer modules 120 transfers BIBs between the BLU 110 and a corresponding burn-in rack 140 that forms part of a burn-in chamber 130. Each of the burn-in racks 140 may have a number of chamber slots (not shown). Each chamber slot is structured to hold one BIB, along with the components that the BIB carries, during a burn-in process. The chamber slots are typically stacked vertically with respect to each other. Consequently, the BIB transfer modules 120 have the capability to move BIBs in the vertical (z-axis) direction. The mechanism that the BIB transfer modules 120 uses to accomplish this vertical movement of the BIBs will be explained in further detail below in the description of the BIB transfer module 120.

Figure 2:
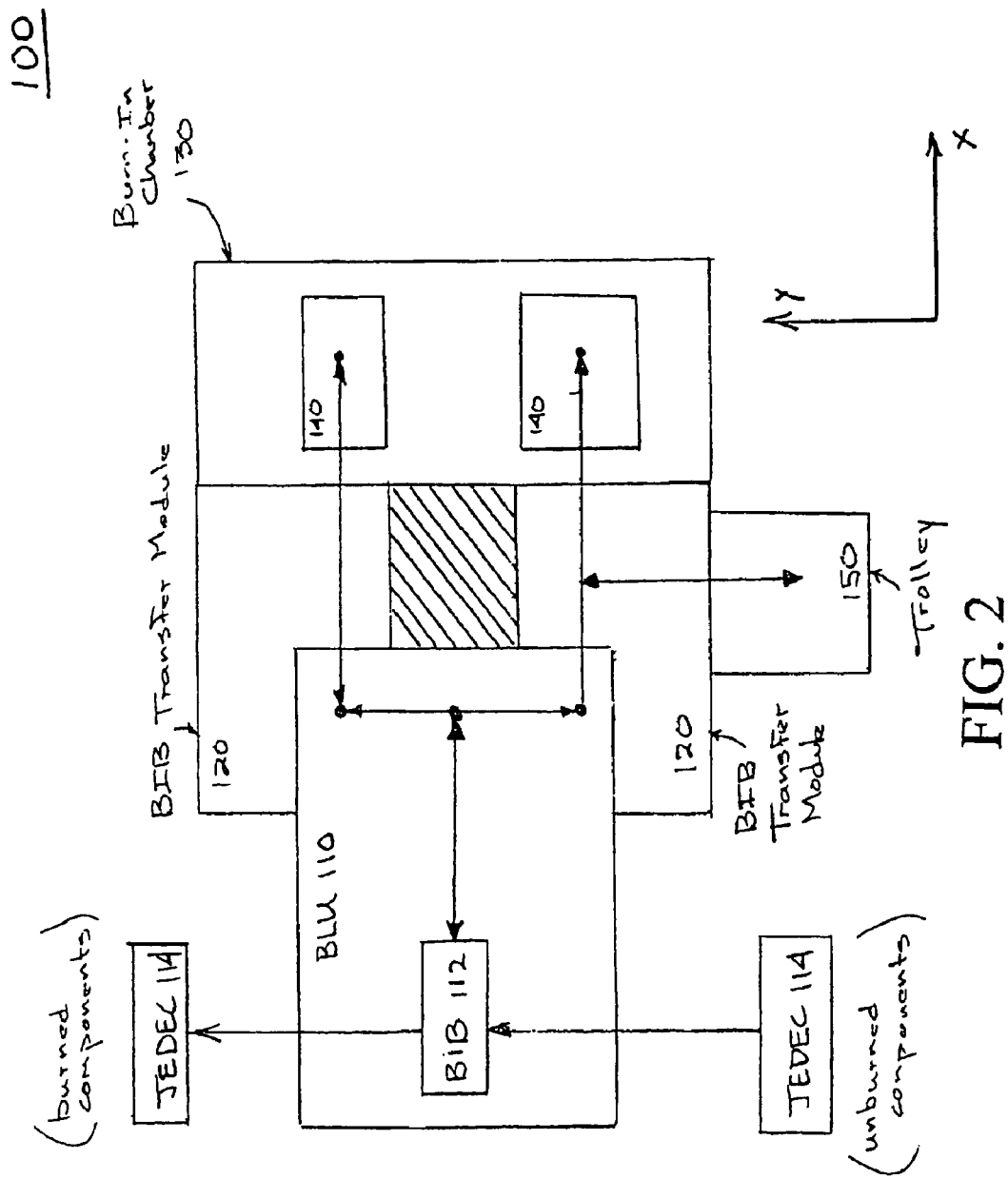
FIG. 2 is a top-view diagram that illustrates the physical footprint and physical relationship between components of the linked burn-in system of FIG. 1, as well as further details of the movement of a JEDEC trays and BIBs within the burn-in system.

FIG. 2 is a top-view block diagram that illustrates the physical footprint and physical relationship between components of the linked module burn-in system 100 of FIG. 1, as well as further details of the movement of a JEDEC tray 114 and a BIB 112 within the burn-in system 100. It should be noted that the components of the burn-in system 100 illustrated in FIG. 2 are not necessarily drawn to scale. Furthermore, the arrows illustrated in FIG. 2, while generally indicative of the paths that the BIBs follow within the system 100, should not be considered to represent exactly the position of the BIBs within the system 100.

Referring to FIG. 2, two BIB transfer modules 120 are shown detachably linked to a standalone BLU 110 and a burn-in chamber 130 that includes two burn-in racks 140. Unburned components are loaded in the BLU 110 using a JEDEC tray 114. The BLU 110 transfers the unburned components to a BIB 112. The BLU 110 may route the BIB 112 to one of the two BIB transfer modules 120 that are linked to the BLU 110. Once the BIB 112 has been transferred to the BIB transfer module 120, the BIB transfer module transfers the BIB 112 to a chamber slot of the corresponding burn-in rack 140 in the burn-in chamber 130. This may require the BIB transfer module 120 to move the BIB 112 in the vertical (z-axis) direction. After the burn-in process is complete, the BIB 112 that contains the burned components is removed from the chamber slot by the BIB transfer module 120 and returned to the BLU 110. The BLU 110 unloads the burned components from the BIB 112 to a JEDEC tray 114 which may then be removed from the BLU.

During the time period that a burn-in is being performed on one BIB 112, there may be other BIBs 112 in the system 100 that are in different stages of their own burn-in process. For example, other BIBs 112 may be in other chamber slots in the burn-in racks 140. Other BIBs 112 may also be present in the BLU 110, where the components are loaded prior to burn-in within the chamber slot and unloaded after burn-in in the chamber slot.

The embodiments of the invention illustrated in FIG. 2 also facilitate parallel processing because as soon as one BIB 112 with unburned components is delivered to one of the BIB transfer modules 120 by the BLU 110, the BLU 110 may immediately retrieve another BIB 112 with unburned components and deliver that BIB to the other BIB transfer module 120. The BLU 110 may also retrieve BIBs 112 with burned components from each of the BIB transfer modules 120 in the same fashion.

Consequently, the above-described embodiments of the invention support slot-level burn-in of components versus batch-level burn-in of components. In other words, because each chamber slot in the burn-in rack 140 may independently perform a burn-in on the components loaded on one BIB 112, the chamber slot may begin burn-in of the corresponding BIB as soon as it is delivered to the chamber slot by the BIB transfer module 120.

Contrasted to conventional burn-in systems where the burn-in chamber and the BLU are widely separated and the burn-in chamber begins to perform a burn-in process only when all the chamber slots are filled with BIBs, embodiments of the invention provide a significant increase in the Units Per Hour per square foot (UPH/ft$^2$) value for the burn-in system.

Referring again to FIG. 2, a trolley 150 may be detachably linked to one or more of the BIB transfer modules 150. The trolley 150 is used to change-out BIBs 112 that are circulating within the system 100. The trolley 150 may also be used to store an additional supply of functioning BIBs 112 in case one of the BIBs 112 that is circulating within the system 100 becomes damaged.

For example, a BIB change-out may occur if the system operator wishes to begin burn-in of components having a different packaging type. The different packaging type may require a BIB with a different physical configuration. Thus, after a BIB 112 having a first physical configuration is unloaded after a burn-in cycle, the BIB transfer module 120 may transfer the BIB to an empty slot in the trolley 150. Then, the BIB transfer module 120 may transfer a BIB 112 having a second physical configuration from another slot in the trolley 150 to the BLU 110.

In this manner, the entire set of BIBs 112 circulating within the system 100 may be swapped for a different set of BIBs 112 having a different physical configuration. In a similar manner, individual damaged BIBs 112 may be exchanged for functioning BIBs 112 stored on the trolley 150 when the need arises. According to embodiments of the invention, the BIBs are 100% utilized by being self-contained in the linked module burn-in system.

As illustrated in FIG. 2, in order to transfer the BIBs from the system 100 to the trolley 150, the BIB transfer module 120 is capable of moving the BIB through a 90 degree change of direction. Embodiments of the invention may accomplish this change of direction through a unique mechanism that will be explained in further detail below in the description of the BIB transfer module 120.

The embodiments of the invention described above provide a system 100 including a BLU 110 and a burn-in chamber 130 linked by a BIB transfer module 120. The system 100 is completely automated. That is, a JEDEC tray filled with unburned components is input into the system 100 and a JEDEC tray filled with burned components is received from the system 100. Because the system 100 is linked, minimizes the physical footprint, and supports slot-level as opposed to batch-level burn-in, the time required for a single BIB to complete a burn-in cycle is substantially reduced and the UPH/ft$^2$ value is substantially increased compared to conventional burn-in systems. Thus, burn-in systems according to embodiments of the invention are linked module systems capable of providing a continuous flow capability to a component burn-in process that efficiently utilizes chamber time and maximizes the UPH/ft$^2$ value.

Maintenance issues are also simplified using embodiments of the invention. The BIB transfer modules 120 are detachably affixed to the burn-in system 100. That is, the BIB transfer modules 120 may be removed from the linked system 100 without disturbing the BLU 110 or the burn-in chamber 130. For example, because the system 100 of FIG. 2 includes two BIB transfer modules 120, the burn-in system 100 may still function, albeit half as fast, if one of the BIB transfer modules 120 must be shut down for repairs. Alternatively, a malfunctioning BIB transfer module 120 could be replaced by a third spare BIB transfer module 120 and burn-in may resume at full capacity.

Similarly, if individual chamber slots of the burn-in racks 140 become faulty, the corresponding BIB transfer module 120 may prevent BIBs from being placed in the malfunctioning chamber slot.

Figure 3A:
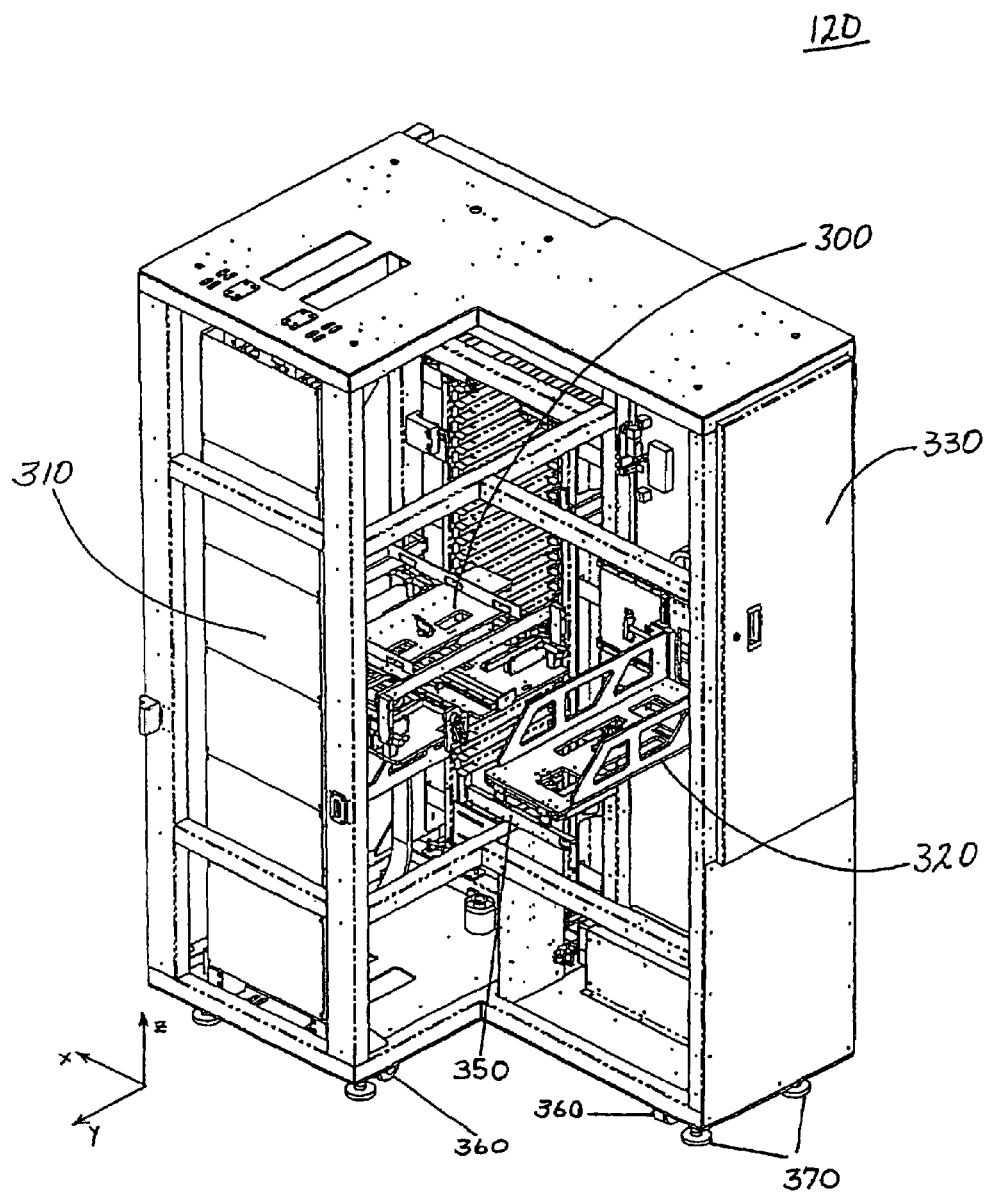
FIGS. 3A and 3B are perspective diagrams further illustrating an example BIB transfer module 120 from the burn-in system of FIG. 2.
Figure 3B:
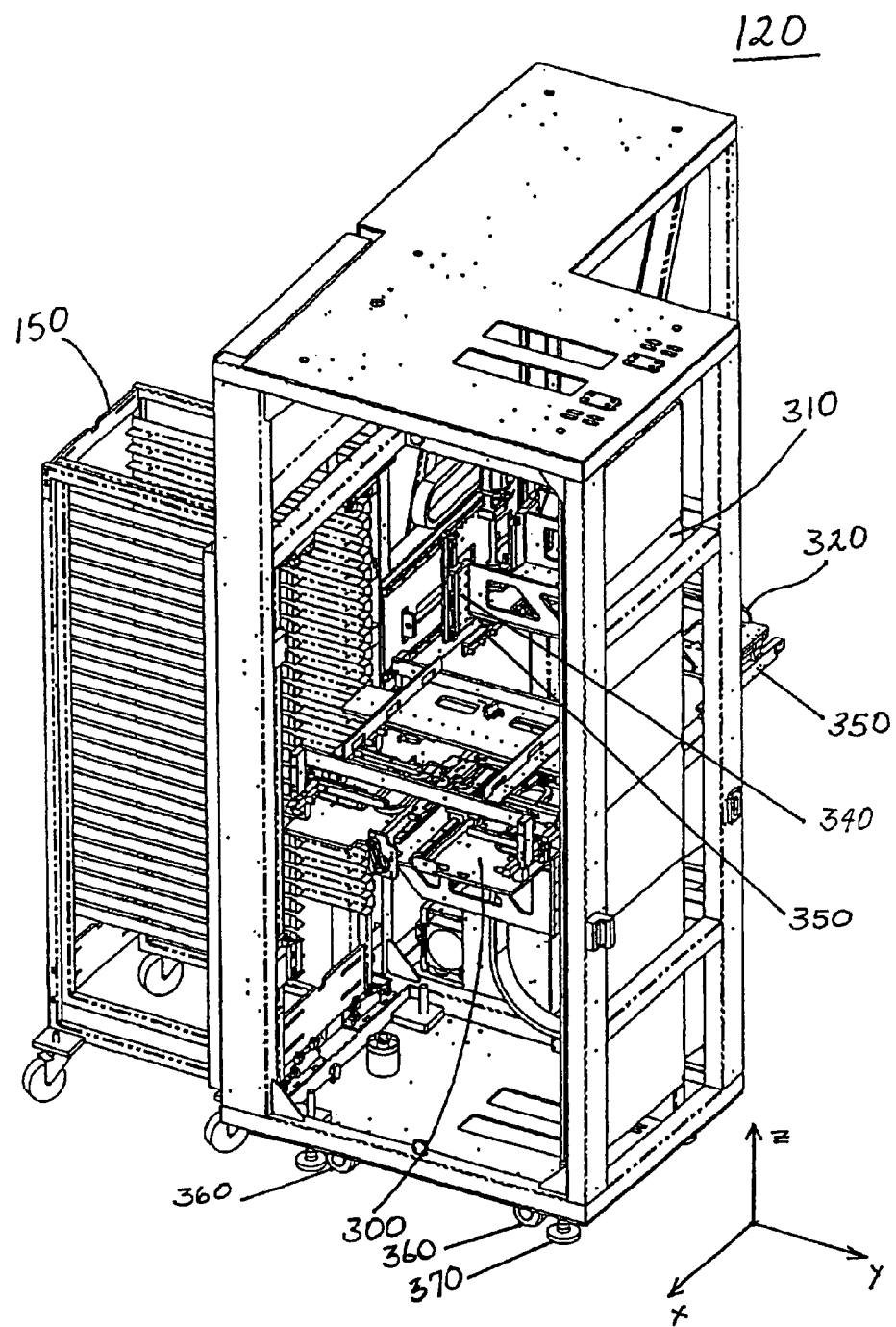

FIGS. 3A and 3B are perspective diagrams further illustrating an example BIB transfer module 120 from the burn-in system of FIG. 2. The L-shaped BIB transfer module 120 of FIGS. 3A and 3B corresponds to the BIB transfer module 120 shown linked to the trolley 150 in FIG. 2.

The BIB transfer module 120 includes a BIB transfer mechanism 300, an elevator 310, a vertical buffer 320, and a buffer elevator 340. The BIB transfer mechanism 300 is attached to the elevator 310, which is capable of raising and lowering the BIB transfer mechanism 300 along the z-axis (vertical axis).

The vertical buffer 320 is attached to the buffer elevator 340, which is capable of raising and lowering the vertical buffer 320 along the z-axis (vertical axis). The vertical buffer 320 includes buffer rails 350 attached to the underside of the vertical buffer. The buffer rails 350 are located on opposite sides of the vertical buffer 320 and aligned in the x-direction. The vertical buffer 320 is capable of reducing and increasing the horizontal distance between the buffer rails 350, and in this manner the buffer rails 350 may be closed around the outside edges of a BIB 112 to suspend the BIB.

The BIB transfer module 120 may also include an access panel 330. The access panel 330 provides a convenient way to access the interior of the BIB transfer module 120 when the BIB transfer module is attached to the BLU 110 and chamber racks 140. There may be other access panels located in other positions on the exterior of the BIB transfer module 120.

A trolley 150 is shown attached to the side of the BIB transfer module 120. As illustrated in FIGS. 3A and 3B, the BIB transfer module 120 may also include wheels 360 that enable the BIB transfer module to be easily positioned between, attached to, and removed from the BLU 110 and the burn-in chamber 130. The BIB transfer module may also include adjustable feet 370.

Figure 4A:
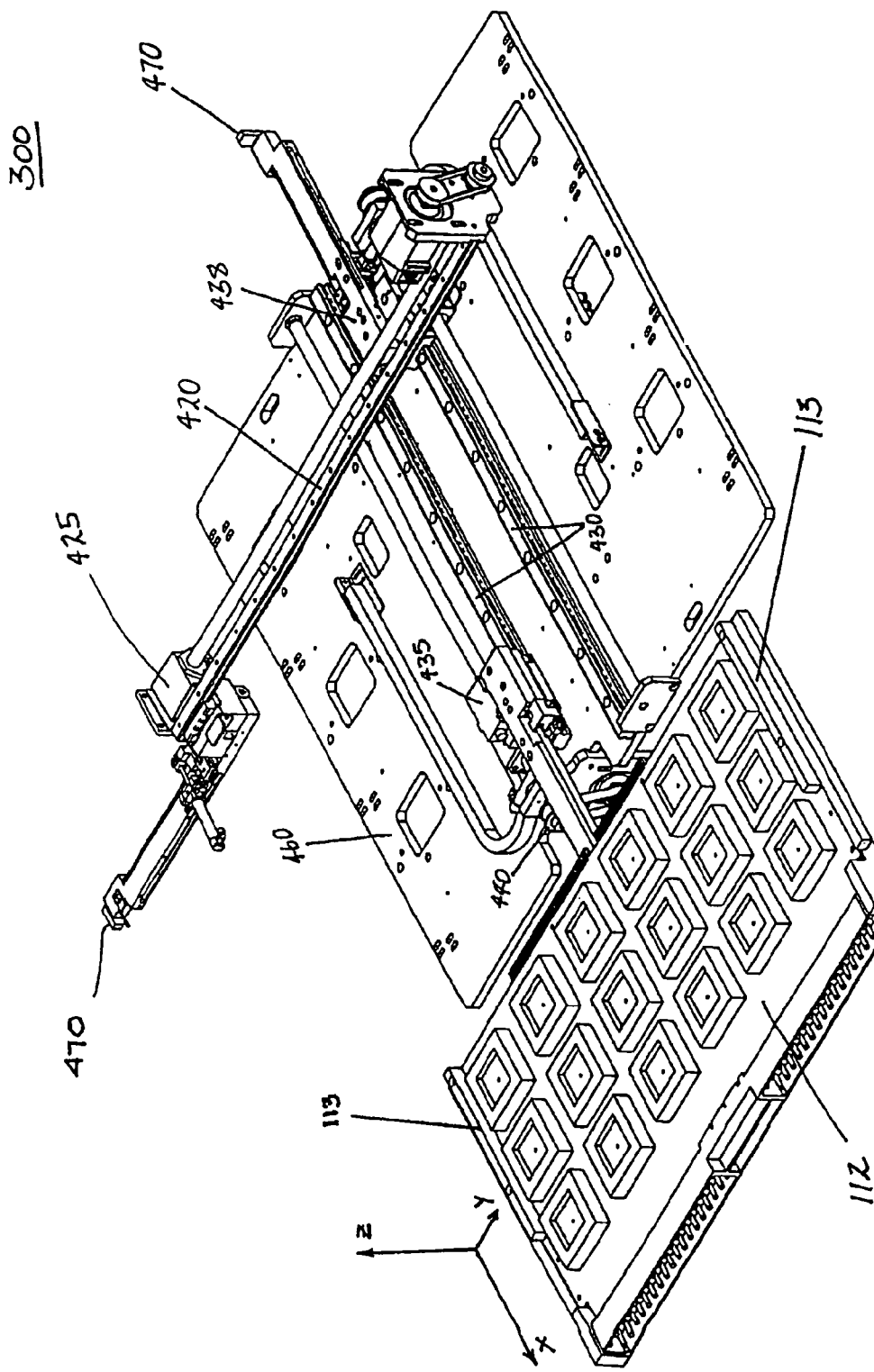
FIGS. 4A, 4B, and 4C are perspective diagrams further illustrating the BIB transfer mechanism of FIGS. 3A and 3B.
Figure 4B:
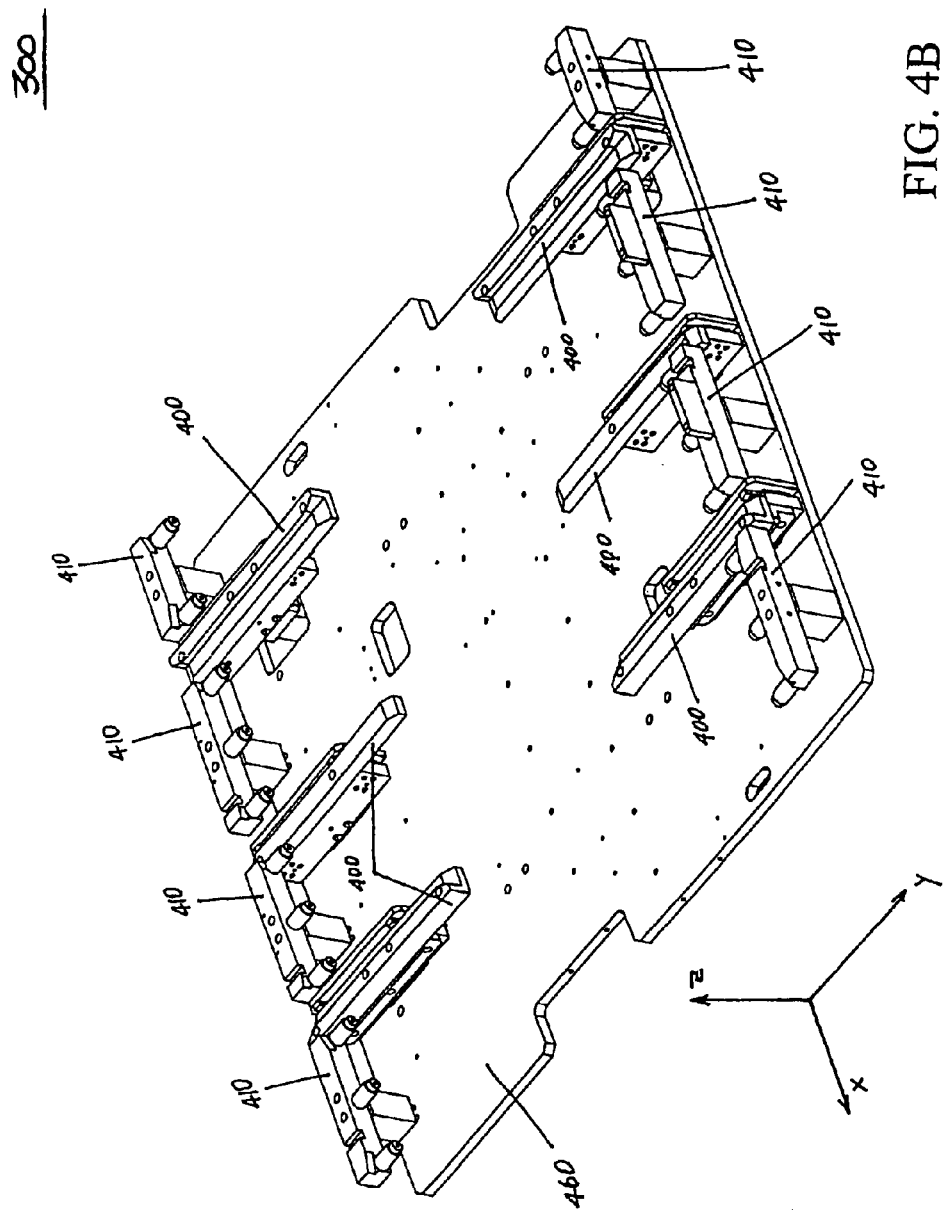
Figure 4C:
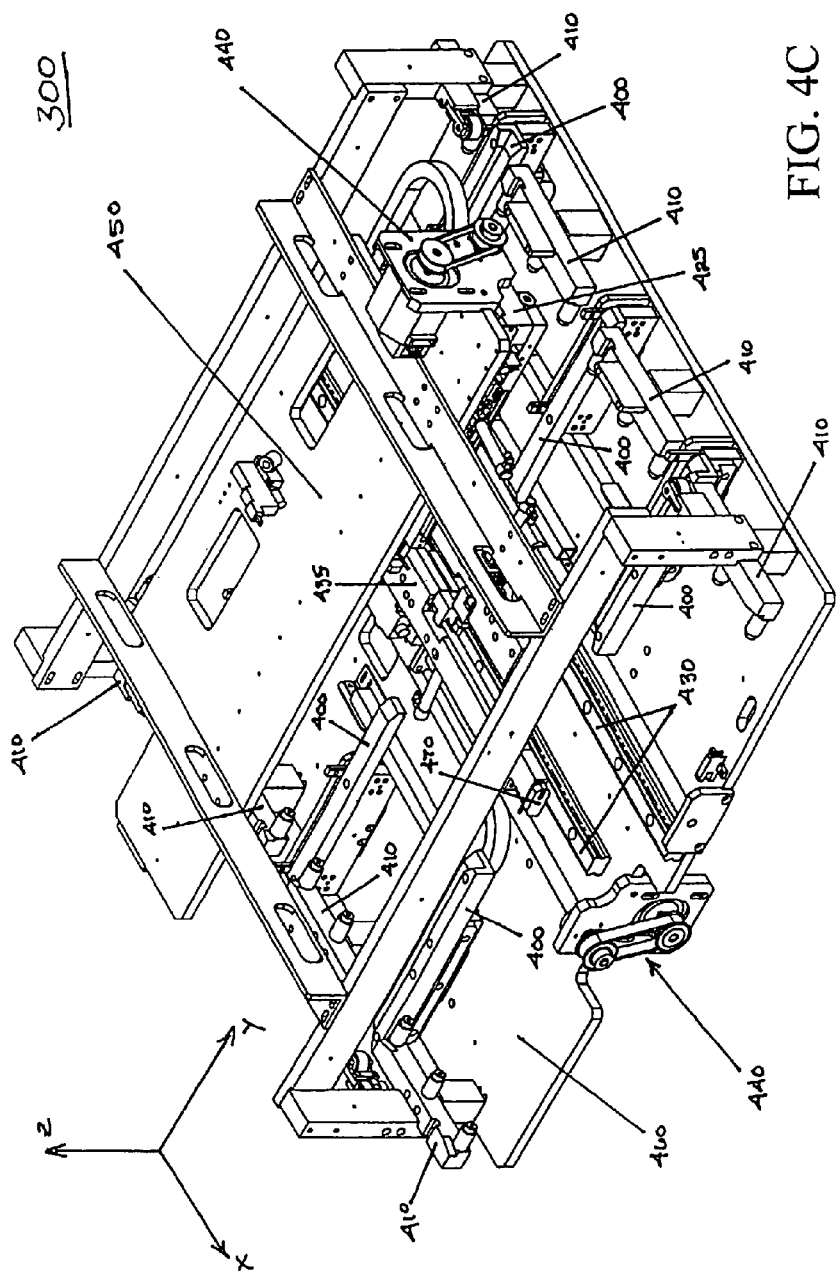

FIGS. 4A, 4B, and 4C are perspective diagrams further illustrating the BIB transfer mechanism 300 of FIGS. 3A and 3B. FIG. 4A is illustrative of the actuator assemblies that are part of the BIB transfer mechanism 300. FIG. 4B is illustrative of the rail assemblies that are part of the BIB transfer mechanism 300. FIG. 4C is illustrative of the actuator assemblies shown in FIG. 4A and the rail assemblies shown in FIG. 4B, as well as additional elements not shown in FIG. 4A or 4B.

In order to avoid excessively detailed drawings that might obscure aspects of the invention, FIGS. 4A, 4B, and 4C each show some, but not all, of the components of the BIB transfer mechanism 300. For example, the embodiments of the invention illustrated in FIGS. 4A, 4B, and 4C may also include a quantity of electrical wiring to deliver power and control signals, as well as optical sensors to detect the position of a BIB 112. However, because these additional elements are not critical for understanding of the invention, they are omitted.

Referring to FIGS. 4A, 4B, and 4C, the BIB transfer mechanism 300 includes a lower plate 460, an upper plate 450, a number of chamber rails 410, and a number of z-axis controllable rails 400. The BIB transfer mechanism 300 also includes two chamber actuator rails 430 and two chamber actuators 435 with associated motors 440, and a trolley actuator rail 420 and trolley actuator 425 with its associated motor 440.

As illustrated in FIGS. 4B and 4C, a number of chamber rails 410 are attached along two of the four sides of the lower plate 460. The chamber rails 410 are aligned along the x-axis of the BIB transfer mechanism 300. The chamber rails 410 support and guide the BIB 112 when the BIB 112 is moved along the x-axis. As is most easily seen in FIG. 4B, each chamber rail 410 is slightly separated from an adjoining chamber rail 410 on the same side of the lower plate 460 by a small gap. The small gaps between the chamber rails 410 serve an important purpose, as will be explained in the following paragraphs.

As illustrated in FIGS. 4B and 4C, a number of z-axis controllable rails 400 are installed on the lower plate 460. The z-axis controllable rails 400 are aligned along the y-axis of the BIB transfer mechanism 300, perpendicular to the chamber rails 410. The z-axis controllable rails 400 support and guide the BIB 112 when the BIB 112 is moved along the y-axis.

The z-axis controllable rails 400 are also located between the small gaps formed between the chamber rails 410. The z-axis controllable rails 400 may be controlled to be selectively raised in the z-axis (vertical) direction. Because of the small gaps between the chamber rails 410, the z-axis controllable rails may be raised above the horizontal level of the chamber rails 410. The z-axis controllable rails 400 may be raised and lowered along the z-axis by actuators, which are obscured beneath the lower plate 460. Other BIB transfer mechanisms 300 according to other embodiments of the invention may include more or less z-axis controllable rails 400 than the number shown in FIGS. 4B and 4C.

As illustrated in FIGS. 4A and 4C, the BIB transfer mechanism 300 also includes two chamber actuator rails 430 attached to the lower plate 460 and two chamber actuators 435 attached to the chamber actuator rails 430. For each of the chamber actuators 435 there is a motor 440 that controls the position and movement of the chamber actuators 435 along the chamber actuator rails 430 by driving a threaded rod that pushes and pulls the chamber actuators 435 along the chamber actuator rails 430. A rotating finger 470 is located at one end of each of the chamber actuators 435. One of the chamber actuators 435, along with its associated chamber actuator rail 430, motor 440, and rotating finger 470, may be referred to as a chamber actuator assembly.

According to the illustrated embodiments of the invention, the position of the rotating finger 470 may be controlled so that in a first position, the rotating finger extends above an adjacent upper surface of corresponding chamber actuator 435, while in a second position the rotating finger 470 is substantially flush with an adjacent upper surface of the corresponding chamber actuator 435.

An example first position can be seen in FIG. 4A, where the first chamber actuator 435 that is not engaging the BIB 112 is shown with a rotating finger 470 that extends above the adjacent upper surface of the first chamber actuator. An example second position may be seen in FIG. 4B, where the second chamber actuator 435 is shown with a rotating finger 470 that is relatively flush with the adjacent upper surface of the second chamber actuator.

When the rotating fingers 470 of the chamber actuators 435 are in the first position, they are configured to contact BIB rails (not shown) mounted to the underside of the BIB 112. The rails are aligned in the y-direction, perpendicular to the movement of the chamber actuators 435, and located at opposite sides of the BIB 112. The rails provide a point at which the chamber actuators 435 may use the rotating fingers 470 to push or pull against the BIB 112. Thus, the chamber actuators 435 are able to move the BIB 112 along the x-axis while the BIB is supported by the chamber rails 410.

The BIB transfer mechanism 300 also includes a trolley actuator rail 420 mounted to the upper plate 450 and a trolley actuator 425 attached to the trolley actuator rail 420. The trolley actuator rail 420 is attached to the underside of the lower plate 450, which is why the trolley actuator rail 420 cannot be seen in FIG. 4C. In order for the trolley actuator rail 420 and trolley actuator 425 to be completely illustrated, they are shown in FIG. 4A in a "floating" position, without the upper plate 450 to which the trolley actuator rail 420 is attached. For the trolley actuator 425 there is a motor 440 that controls the position and movement of the trolley actuator 425 along the trolley actuator rail 420 by driving a threaded rod that pushes and pulls the trolley actuator 425 along the trolley actuator rail 420. A rotating finger 470 may be located at one end of the trolley actuator 425. The trolley actuator 425, along with its associated trolley actuator rail 420, motor 440, and rotating finger 470, may be referred to as a trolley actuator assembly.

According to the illustrated embodiments of the invention, the position of the rotating finger 470 may be controlled so that in a first position, the rotating finger extends below the adjacent lower surface of the trolley actuator 425, while in a second position the rotating finger 470 is substantially flush with the adjacent lower surface of the trolley actuator 425. In FIG. 4A, the trolley actuator 425 is shown with a rotating finger 470 that is in the second position. If the rotating finger 470 of the trolley actuator 435 were in the first position, it would exhibit a position similar to the rotating finger 470 of the chamber actuator 435 shown in FIG. 4A, except of course extending downwards rather than upwards.

According to the illustrated embodiments of the invention, when the rotating finger 470 of the trolley actuator 425 is in the first position, it is configured to contact BIB rails 113 that are attached to the top side of the BIB 112. The BIB rails 113 are aligned in the x-direction, perpendicular to the movement of the trolley actuator 425, and located at opposite sides of the BIB 112. The BIB rails 113 provide a point at which the trolley actuator 425 may use the associated rotating finger 470 to push or pull against the BIB 112. Thus, the trolley actuator 425 is able to move the BIB 112 along the y-axis while the BIB is being supported by the z-axis controllable rails 400.

According to the illustrated embodiments of the invention, the BIB rails 113 are aligned in the x-direction on opposite sides of the BIB 112, while the BIB rails (not shown) on the underside of the BIB 112 are aligned in the y-direction. Because the BIB 112 is rectangular, the BIB rails 113 may be shorter than the BIB rails (not shown) on the underside of the BIB 112.

It is preferable that the BIB 112 include some sort of structural member, other than the sockets that hold the components, for the rotating fingers 470 of the chamber actuator assemblies and the trolley actuator assembly to interface with. In the illustrated embodiments of the invention, these structural members are the BIB rails 113. In alternative embodiments of the invention, the length of the BIB rails 113 may be different. For example, the BIB rails 113 may be just long enough to contact the rotating finger 470 of the trolley actuator assembly. Similarly, in alternative embodiments of the invention, the length of the BIB rails (not shown) on the underside of the BIB 112 may be just long enough to contact the rotating fingers 470 of the chamber actuator assembly. In still other embodiments of the invention, the rotating fingers 470 may instead be designed to interface with recessed slots or holes in the surface of the BIB 112, or some other structural member that protrudes from the surface of the BIB 112.

The trolley actuator rail 420 is arranged perpendicularly with respect to the chamber actuator rails 430. The trolley actuator assembly facilitates movement of the BIB 112 in the y-direction, while the chamber actuator assemblies facilitate movement of the BIB 112 in the x-direction. It should be apparent that in other embodiments of the invention, the z-axis controllable rails 400 and the trolley actuator assembly may be arranged to facilitate movement of the BIB 112 in the x-direction, while the chamber rails 410 and the chamber actuator assemblies facilitate movement of the BIB 112 in the y-direction.

According to the embodiments illustrated above, the BIB transfer mechanism 300 is capable of moving the BIB 112, using the chamber actuator assemblies, to a position adjacent to either side of the BIB transfer mechanism 300 in the x-direction. The maximum distance that the BIB 112 may be moved away from the BIB transfer mechanism will depend upon the overall length of the chamber actuator 435 and the maximum displacement position of the chamber actuator 435 along the corresponding chamber actuator rail 430.

As illustrated in FIG. 4A, the BIB 112 is shown fully extended away from the BIB transfer mechanism 300 in the positive x-direction. This is the position where the chamber rack 140 of FIG. 2 would be located. As shown in FIG. 3, the BIB transfer mechanism 300 is attached to the elevator 310. The height of the BIB transfer mechanism 300 may be easily adjusted, using the elevator 310, so that as the BIB 112 is moved off of the chamber rails 410 by the chamber actuator assembly, the BIB 112 slides easily into the selected chamber slot of the chamber rack 140. Each chamber slot has its own rails (not shown) that are capable of supporting the BIB 112.

Similarly, the other chamber actuator assembly of FIG. 4A may be used to extend the BIB 112 away from the BIB transfer mechanism 300 in the negative x-direction. This position corresponds to where the transfer between the BIB transfer mechanism 300 and the vertical buffer 320 (FIG. 3A) occurs.

According to the illustrated embodiments of the invention, the BIB transfer mechanism 300 is capable of moving the BIB 112, using the trolley actuator assembly, to a position adjacent to one side of the BIB transfer mechanism 300 in the negative y-direction. The maximum distance that the BIB 112 may be moved away from the BIB transfer mechanism will depend upon the overall length of the trolley actuator 425 and the maximum displacement position of the trolley actuator 425 along the trolley actuator rail 420.

The position adjacent to one side of the BIB transfer mechanism 300 in the negative y-direction corresponds to the position where the trolley 150 of FIG. 2 would be located. As shown in FIG. 3, the BIB transfer mechanism 300 is coupled to the elevator 310. The height of the BIB transfer mechanism 300 may be easily adjusted, using the elevator 310, so that as the BIB 112 is moved off of the z-axis controllable rails 400 by the trolley actuator assembly, the BIB 112 slides easily into one of the selected open positions of the trolley 150. As illustrated in FIGS. 3A and 3B, each trolley 150 has a number of pairs of rails, each pair of rails arranged vertically above or below the other, each pair of rails capable of supporting the BIB 112.

According to the illustrated embodiments of the invention, the BIB transfer mechanism 300 may move the BIB 112 in the positive x-direction or the negative x-direction when the BIB 112 is supported by the chamber rails 410. Similarly, the BIB transfer mechanism may move the BIB 112 in the positive y-direction or the negative y-direction when the BIB 112 is supported by the z-axis controllable rails 400.

According to the illustrated embodiments of the invention, when the z-axis controllable rails 400 are raised above the level of the chamber rails 410, a BIB 112 that is positioned on the chamber rails 410 is lifted from the chamber rails 410 by the z-axis controllable rails 400. The BIB 112 is lifted sufficiently high so that the rotating finger 470 of the trolley actuator assembly may engage the BIB rails 113, allowing the BIB transfer mechanism 300 to push and/or pull the BIB 112 along the y-axis.

Conversely, when the z-axis controllable rails 400 are positioned below the level of the chamber rails 410, the BIB 112 is supported by the chamber rails 410 and not by the z-axis controllable rails 400. Preferably, when the BIB 112 is supported by the chamber rails 410, only the rotating fingers 470 of the chamber actuator assemblies may engage the BIB rails (not shown) on the underside of the BIB 112, allowing the BIB transfer mechanism 300 to push and/or pull the BIB 112 along the x-axis.

Thus, according to the embodiments of the invention described above, a BIB transfer module 120 may easily move a BIB 112 in perpendicular directions while minimizing the required physical footprint by using the BIB transfer mechanism 300. In other words, the BIB transfer mechanism 300, which has a physical footprint that is equal to only about the area of one BIB, may position a BIB adjacent to the BIB transfer mechanism in three directions through utilization of the chamber actuator assemblies and the trolley actuator assembly.

According to alternative embodiments of the invention, the BIB transfer mechanism 300 of FIGS. 4A, 4B, and 4C may include a second trolley actuator assembly. This would allow the BIB transfer mechanism 300 to move a BIB 112 away from the BIB transfer mechanism in the positive y-direction. Although such a configuration for the BIB transfer mechanism 300 would not be useful for the burn-in system 100 illustrated in FIG. 2, these embodiments may be useful in other burn-in systems where the BLU 110, the BIB transfer module 120, and the burn-in chamber 130 have different physical footprints.

In the embodiments illustrated above, chamber rails 410 and z-axis controllable rails 400 are used to guide and support the BIB 112 as it is moved along the x-axis and the y-axis, respectively. However, other embodiments of the invention may utilize structures other than rails, although rails are preferred.

For example, a BIB transfer mechanism according to alternative embodiments of the invention may have a number of posts with small wheels attached to the top of the posts. The axis of rotation of some of the wheels may be parallel to the x-axis, while the axes of rotation of other wheels may be parallel to the y-axis. The posts having wheels with axes of rotation parallel to the x-axis would therefore rotate to enable movement parallel to the y-axis, and the posts having wheels with axes of rotation parallel to the y-axis would rotate to enable movement parallel to the x-axis.

One set of posts, for example, the set of posts having wheels with axes of rotation parallel to the x-axis, may be structured such that their vertical height is adjustable with respect to the set of posts having wheels with axes of rotation parallel to the y-axis. Thus, the set of posts that have an adjustable vertical height is functionally similar to the z-axis controllable rails 400 of the embodiments illustrated above. The set of posts that do not have an adjustable vertical height is functionally similar to the chamber rails 410 of the embodiments illustrated above.

In these alternative embodiments of the invention, when the BIB is supported by a particular set of posts, the wheels on the posts may be structured to roll along corresponding grooves on the underside of the BIBs that are arranged parallel to the x-axis or parallel to the y-axis. Or, the wheels on the posts may be structured to roll along corresponding gaps formed between adjacent BIB rails that are attached to the underside of the BIBs.

To provide an overall understanding of the above-described embodiments of the invention, an example route for one BIB 112 as it moves through the burn-in system 100 of FIG. 2 will be briefly described below, with reference to FIGS. 2, 3, and 4.

During operation of the burn-in system 100, a JEDEC tray 114 filled with unburned components is loaded in the BLU 110. The BLU 110 unloads the unburned components from the JEDEC tray 114 and places them on an empty BIB 112 which is circulating within the burn-in system 100. The BLU 110 may then place the BIB 112 beneath the vertical buffer 320 of the BIB transfer module 120.

The vertical buffer 320 is capable of moving along the z-axis (vertical axis) as well as along the x-axis. The vertical buffer 320 may be lowered to be placed in close proximity with the BIB 112. The vertical buffer 320, by adjusting the distance between the buffer rails 350 and the vertical distance to the BIB 112, may control the buffer rails 350 so that they support the BIB and raise it from the supporting surface of the BLU 110. Next, the vertical buffer 320 may move the BIB 112 in the positive x-direction, positioning the BIB so that it is located adjacent to the BIB transfer mechanism 300.

Using one of the two chamber actuator assemblies that was described above, the BIB transfer mechanism 300 engages a BIB rail (not shown) that is attached to the underside of the BIB 112 with the rotating finger 470, and pulls the BIB 112 onto the chamber rails 410, towards the center of the BIB transfer mechanism 300, in the positive x-direction. Once the BIB 112 is within the boundaries of the BIB transfer mechanism 300, the BIB transfer mechanism may be moved in the positive or negative z-direction so that the upper surfaces of the chamber rails 410 are substantially even with the upper surfaces of the selected chamber slot in the attached chamber rack 140.

At some point, the first chamber actuator assembly is unable to pull the BIB 112 any further in the positive x-direction, and the second of the two chamber actuator assemblies engages the other BIB rail (not shown) that is attached to the underside of the BIB 112 with the rotating finger 470. The second chamber actuator assembly is then able to push the BIB 112 from off of the chamber rails 410 and into the selected chamber slot of the chamber rack 140 so that the BIB 112 may be connected to the electrical contacts that are present with the chamber slot. The burn-in process for the BIB 112 may then begin.

After the burn-in process is finished, the baked components on the BIB 112 may be transferred to a JEDEC tray 114 after the BIB 112 is unloaded from the chamber rack 140 by performing substantially the reverse of the above-described processes.

According to the above embodiments of the invention, BIBs 112 that are circulating within the system may also be quickly and easily swapped for other BIBs with the aid of a conventional trolley that is detachably affixed to the BIB transfer module 120.

To further provide an overall understanding of the above-described embodiments of the invention, an example route for one BIB 112 as it is swapped out of the system will be described with reference to FIGS. 2, 3, and 4. In the following description, a BIB 112 that is to be placed into the burn-in system 100 will be referred to as "new," while a BIB 112 that is to be removed from the burn-in system 100 will be referred to as "old."

A conventional trolley 150, loaded with new BIBs 112, may be attached to one side of the BIB transfer module 120, as illustrated in FIG. 2. The elevator 310 may be used to adjust the height of the BIB transfer mechanism 300 so that the trolley actuator assembly is capable of engaging a BIB rail 113 of a selected BIB 112 that is loaded on the trolley 150 with the rotating finger 470.

The BIB transfer mechanism 300 activates the z-axis controllable rails 400 so that they rise above the upper surfaces of the chamber rails 410. The height of the z-axis controllable rails 400 is controlled so that an upper surface of the z-axis controllable rails 410 is substantially level with an upper surface of a rail that supports the selected BIB 112 in the trolley 150.

Once the z-axis controllable rails 400 are in place, the trolley actuator assembly pulls the selected BIB 112 from the trolley and onto the z-axis controllable rails 400. At the appropriate position of the BIB 112, the z-axis controllable rails 400 are lowered beneath the upper surface of the chamber rails 410, allowing the BIB 112 to be supported by the chamber rails.

If necessary, the elevator 310 moves the BIB transfer mechanism 300, along with the selected BIB 112, to a height corresponding to the vertical buffer 320. Next, the BIB transfer mechanism slides the BIB 112 off of the chamber rails 410 and onto the buffer rails 350 of the vertical buffer 320 using a chamber actuator assembly. Next, the vertical buffer 320, by adjusting the distance between the buffer rails 350 and the vertical distance to the BLU 110, may place the new BIB 112 on the supporting surface of the BLU 110.

The BLU 110 moves an old BIB 112 to where it can be picked up by the vertical buffer 320, and by following processes substantially the reverse of those described above the old BIB 112 is placed in a corresponding empty position of the trolley 150 using the BIB transfer module 120.

Using the processes described above, a burn-in system 100 according to the illustrated embodiments of the invention exhibit a marked increased in the UPH/ft$^2$ value compared to conventional burn-in systems. This increase is attributable to the fact that the illustrated embodiments of the invention support slot-level burn-in, and that the BLU 110 and burn-in oven 120 are no longer widely separated.

For example, once the BLU 110 delivers a BIB 112 with unbaked components to the first BIB transfer module 120, it may immediately deliver another BIB 112 with unbaked components to the second BIB transfer module 120. The BIB transfer modules 120 may then transfer the BIBs 112 with unbaked components to an unoccupied chamber slot in the corresponding chamber rack 140. Once the BIB 112 is loaded in the chamber slot, the burn-in process for the unbaked components on the BIB 112 may begin.

The BIB transfer modules 120 may then immediately pick up another BIB 112 loaded with unbaked components and load the BIB into the corresponding chamber rack 140. Alternatively, the BIB transfer modules 120 may first remove a BIB 112 that has completed the burn-in cycle from its chamber slot and return it to the BLU 110 before receiving the next BIB 112 with unbaked components.

A typical chamber rack 140 may contain, for example, 16 chamber slots. Assuming that the illustrated BIB transfer module 120 began filling a chamber rack 140 having 16 initially empty chamber slots, a BIB 112 loaded in the topmost chamber slot would complete the burn-in cycle well before the lowermost chamber slot could be filled. Thus, the BIB transfer module 120 would soon begin, in each round trip, delivering a BIB 112 with unbaked components to the chamber rack 140 and returning a BIB 112 with baked components to the BLU 110 for repackaging on a JEDEC tray.

The preceding embodiments are exemplary. Those of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

Although the specification may refer to "an", "one", "another", or "some" embodiment(s) in several locations, this does not necessarily mean that each such reference is to the same embodiment(s), or that the feature only applies to a single embodiment.

Many of the specific features shown herein are design choices. The number and type of JEDEC trays, the number and type of BIBs, the number of BIB transfer modules, the number of BLUs, and the number of burn-in chambers are all merely presented as examples. For instance, in the exemplary embodiments described above a single BLU was linked to two burn-in chambers by two BIB transfer modules. However, it should be apparent that in other embodiments of the invention a single BLU may be connected to a single burn-in chamber, or a BLU could be connected to three or more burn-in chambers by a corresponding number of BIB transfer modules.

Likewise, functionality embodied in a single module or functional block of the burn-in system may be implemented using multiple cooperating circuits or blocks, or vice versa. For example, the BIB transfer modules described above may be separated from the BLU unit. However, according to other embodiments of the invention the BIB transfer module may form an integral part of the BLU unit. Such minor modifications are encompassed within the embodiments of the invention, and are intended to fall within the scope of the attached claims.

We claim:

1. A device comprising:
   a burn-in board (BIB) transfer mechanism structured to move a BIB in a first direction and in a second direction that is perpendicular to the first direction; and
   an elevator attached to the BIB transfer mechanism and structured to move the BIB transfer mechanism in a third direction that is perpendicular to the first direction and that is perpendicular to the second direction;
   wherein the device is structured to be detachably affixed to burn-in chamber in the first direction and structured to be detachably affixed to a trolley in the second direction.

2. The device of claim 1, the BIB transfer mechanism comprising:
   a first set of structural members, the first set of structural members structured to support the BIB when the BIB is moved in the first direction; and
   a second set of structural members, the second set of structural members structured to support the BIB when the BIB is moved in the second direction.

3. The device of claim 2, wherein the BIB transfer mechanism is structured to adjust a relative distance between the first set of structural members and the second set of structural members in the third direction.

4. The device of claim 3, wherein the relative distance is adjusted by moving the first set of structural members in the third direction.

5. The device of claim 4, wherein the first set of structural members comprises a first set of rails and wherein the second set of structural members comprises a second set of rails.

6. The device of claim 5, wherein the first set of rails is structured to contact the BIB along opposite sides of the BIB.

7. The device of claim 2, the BIB transfer mechanism further comprising:
   a first actuator assembly structured to push or pull the BIB in the first direction; and
   a second actuator assembly structured to push or pull the BIB in the second direction.

8. The device of claim 1, further comprising wheels and adjustable feet, the wheels and adjustable feet each configured to support the weight of the device.

* * * * *